(12) United States Patent  
Fink (10) Patent No.: US 7,143,887 B2
(45) Date of Patent: Dec. 5, 2006

(54) MULTI-POSITION STOP MECHANISM (75) Inventor: Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 79 days.

(21) Appl. No.: 10/743,057

(22) Filed: Dec. 23, 2003

(65) Prior Publication Data

US 2005/0132829 A1 Jun. 23, 2005

(51) Int. Cl.
*F16D 71/04* (2006.01)
(52) U.S. Cl. ........................ 192/138; 192/143
(58) Field of Classification Search ............... 192/138, 192/143
See application file for complete search history.

(56) References Cited

U.S. PATENT DOCUMENTS

| | | | |
|---|---|---|---|
| 3,169,619 A * | 2/1965 | Mahan et al. ............... | 192/143 |
| 4,039,419 A * | 8/1977 | Buse ........................... | 204/225 |
| 4,625,539 A * | 12/1986 | Brooks et al. ................ | 72/402 |
| 6,334,398 B1 * | 1/2002 | Eason et al. .................. | 108/20 |

* cited by examiner

*Primary Examiner*—Saul Rodriguez
(74) *Attorney, Agent, or Firm*—Oblon, Spivak McClelland, Maier & Neustadt, P.C.

(57) ABSTRACT

A multi-stop mechanism for providing multiple stop positions between first and second objects that are movable into and out of contact with one another. The multi-stop mechanism of the present invention includes a housing which secures the multi stop mechanism to the first object and/or the second object, a rotatble shaft rotatably mounted to the housing, and plurality of stops located on the rotatable shaft. When the shaft is rotated within the housing, the stops are rotated to different positions relative to the housing. As such, the rotatable shaft positions one of the stops to contact the first or second object that the multi-stop mechanism is not attached to.

30 Claims, 11 Drawing Sheets

MULTI-POSITION STOP MECHANISM

BACKGROUND OF THE INVENTION

1. Field of the Invention

This invention is related to semiconductor substrate positioning mechanism inside a semiconductor device manufacturing system.

2. Description of the Related Art

In the processing of semiconductor substrates, the substrates are at various times placed inside a process chamber where the substrates are subjected to different processing parameters. For example, within an etching process chamber, a semiconductor wafer is placed on a semiconductor support element, such as a chuck assembly, which can serve as a lower electrode. Positioned above the chuck is an upper electrode assembly. The chuck assembly and the upper electrode assembly generate a plasma used, for example, to etch the semiconductor wafer placed on the chuck assembly.

In such an etching process chamber, the semiconductor wafer should be positioned at a certain distance from the upper electrode assembly. To achieve that operation, the chuck assembly, on which the semiconductor wafer is mounted, is moved up and down within the process chamber by a drive system to a desired height below the upper electrode assembly. For example, an operator of a semiconductor processing equipment can set a desired height of a semiconductor wafer within a process chamber by adjusting the extension of drive screws to a desired extension. Movement of the chuck assembly contacts tip ends of the drive screws and thus stops the chuck a desired height within the semiconductor processing chamber. As known in the art, various sensors and feedback systems can be employed to monitor the height of the chuck within the processing chamber to ensure that the chuck supports the semiconductor wafer at the desired height.

Thus, prior art positioning devices can involve chuck assembly movement utilizing multiple lead screw assemblies or pneumatic assemblies. These types of mechanisms typically utilize stop mechanisms along with associated sensors and feedback devices to stop the chuck assembly at a desired position within the semiconductor processing equipment.

Figure 3:
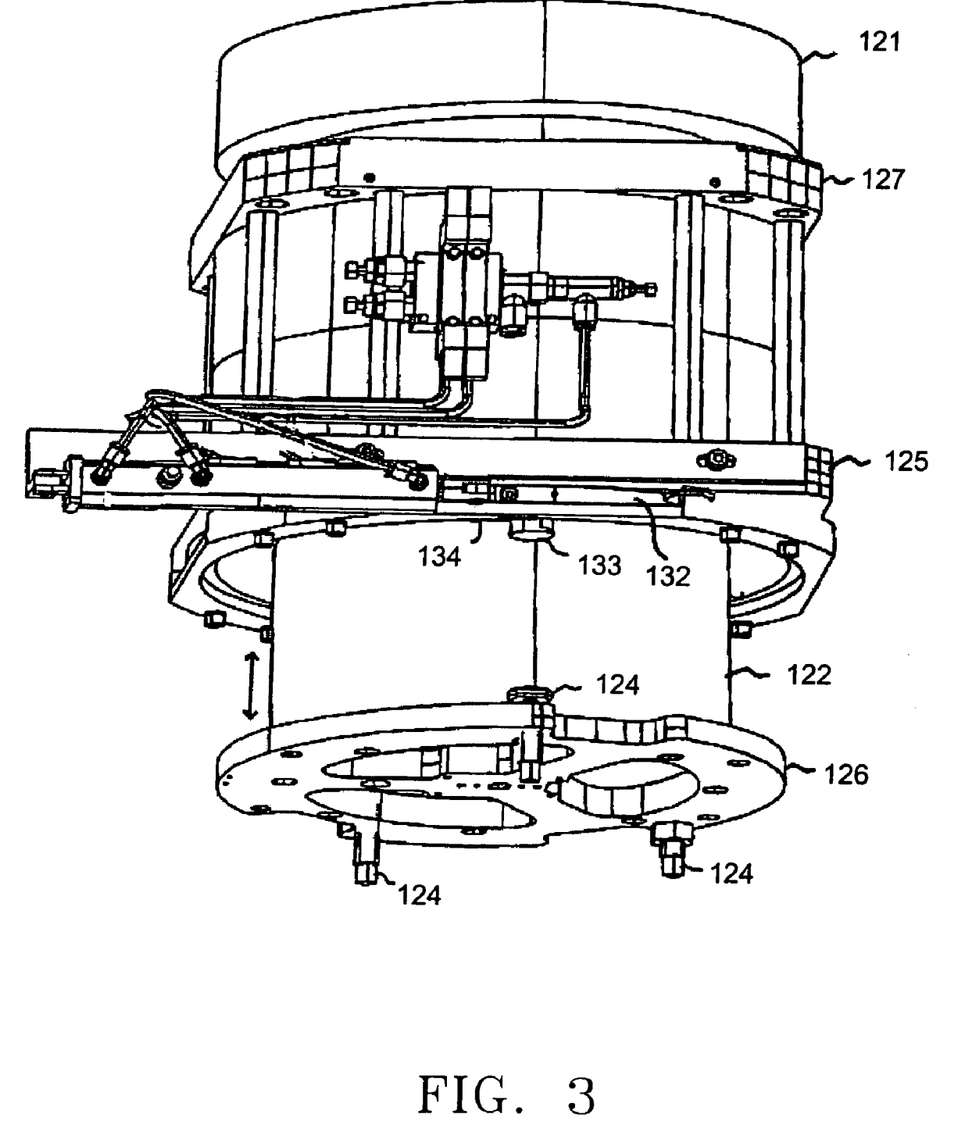
FIG. 3 is a schematic of a background semiconductor chuck assembly.

For example, pneumatic systems such as described by Eason Jr. et al, in U.S. Pat. No. 6,334,398, the entire contents of which are incorporated by reference, have been used with stops to position a semiconductor support element inside a semiconductor processing equipment, as shown in FIG. 3. FIG. 3 shows a chuck 121 on which a semiconductor wafer is secured. The chuck 121 in turn is supported by a cylinder 122 which moves up and down to pass through an upper support bracket 127 and a lower support bracket 125. The cylinder 122 also includes a lower base 126 attached thereto to move with the cylinder 122.

To ensure that the chuck 121 is at an appropriate height within a processing chamber, the lower base 126 includes three stop screws 124. The stop screws 124 may be adjusted to different heights. Moreover, the device includes a rotatable ring 132 having stop surfaces 133 and 134 configured with different heights, which may be aligned with the stop screws 124. When the cylinder 122 is moved upward, the stop screws 124 will abut against either surfaces 133, surfaces 134 or a bottom of the lower support bracket 125 to stop the cylinder 122 at an appropriate position. As a result the chuck 121 stops at an appropriate height within the processing chamber. An operator of semiconductor equipment may adjust the positioning of the ring 132 and or stop screws 124 to adjust the position at which the chuck 121 stops within the processing chamber.

While prior art chuck height adjustment systems such as shown in FIG. 3 allow adjustment of the chuck assembly to different heights, the adjustment components, such as rotatable ring 132, are typically large and complex, thereby generally requiring a moving device such as a cylinder and associated control circuitry to provide accurate and repeatable movement. Moreover, the complexity of prior art adjustment systems makes it difficult to retrofit such systems into existing processing chambers. In addition, known adjustment systems are generally limited to a small number of adjustment positions. For example, the mechanism of FIG. 3 provides only 3 different heights that can be achieved for a given setting of the stop screws. Finally, the prior art adjustment systems generally use metal hard stops that may wear or damage parts after repeated contact.

SUMMARY OF THE INVENTION

One object of the present invention is to address the above described and/or other problems in the art of semiconductor processing devices.

Another object of the present invention is to provide a multi-position stop mechanism suitable for application in semiconductor processing equipment, which allows a height of an object supported to be varied.

Accordingly, one object of the present invention is to provide a multi-position stop mechanism that can be inserted in a load path of two objects to provide multiple stops for relative movement between the two objects.

Another object of the present invention is to provide a multi-position stop mechanism capable of as many multiple stop positions as functionally required by the semiconductor processing application in use.

Still another object of the present invention is to provide a multi-position stop mechanism that can be adjusted and/or varied by an operator, whether manually or by some other method.

Yet, another object of the present invention is to provide a multi-position stop mechanism having either hard or soft stops.

Accordingly, various of these and other objects are accomplished in at least one exemplary embodiment of the present invention including a multi-stop mechanism for providing multiple stop positions between first and second objects that are movable into and out of contact with one another. The multi-stop mechanism of the present invention includes a housing which secures the multi-stop mechanism to the first object or the second object, or both, a rotatble shaft rotatably mounted to the housing, and plurality of stops located on the rotatable shaft. When the shaft is rotated within the housing, the stops are rotated to different positions relative to the housing. As such, the rotatable shaft positions one of the stops to contact the first or second object that the multi-stop mechanism is not attached to.

In one aspect of the present invention, the multi-position stop mechanism allows independent height adjustment with respect to the various parts of the semiconductor processing apparatus in which the positioning device is a part of, and in turn provides movement adjustment, control of a position, or both, of a semiconductor wafer from one part of the semiconductor processing apparatus with respect to another part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENTS

Figure 1A:
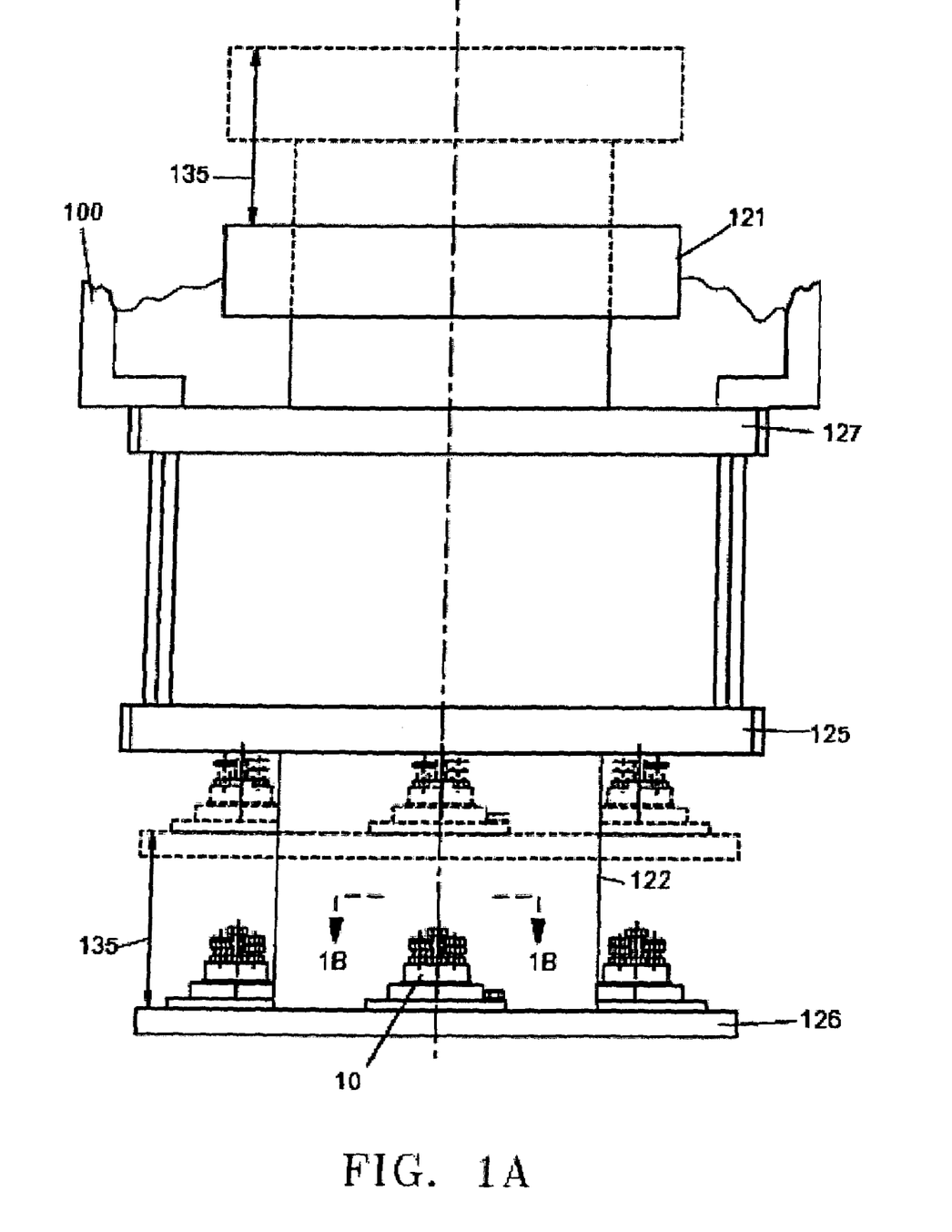
FIG. 1A depicts a pneumatically actuated semiconductor chuck assembly having a multi position stop mechanisms in accordance with the present invention.

Referring now to the drawings, FIG. 1A depicts a view of a multi-position stop mechanism in accordance with one embodiment of the present invention utilized in a semiconductor processing system. Other types of mechanical or electromechanical equipment as well as semiconductor processing systems can utilize the multi-position stop mechanism of the present invention.

While FIG. 1A shows the invention as used on a pneumatically actuated semiconductor processing chamber, one of ordinary skill in the art would realize that the present invention may be utilized in situations where two separate parts or assemblies of an apparatus move in some manner with respect to each other, such as for example motion between parts 125 and 126 of the semiconductor chuck apparatus shown in FIG. 1A. A general implementation of the invention is to provide different stop distances between translatable plates that move into and out of stop contact with one another. In this regard, the invention is interposed between the two objects (e.g. plates) to provide the stop contact for the objects. Thus, a contact stop between the objects that stops relative movements 135 between the objects is not necessarily provided by the objects themselves. Examples of such motion can be linear, circular motion, or other prescribed directions. One member, such as for example part 125, can be considered static and the other member, such as for example part 126, can be considered dynamic. The multi-position stop mechanisms 10 of the present invention can be affixed to either the static member or the dynamic member, or affixed to both members to provide stops for the relative motion between the parts.

Figure 1B:
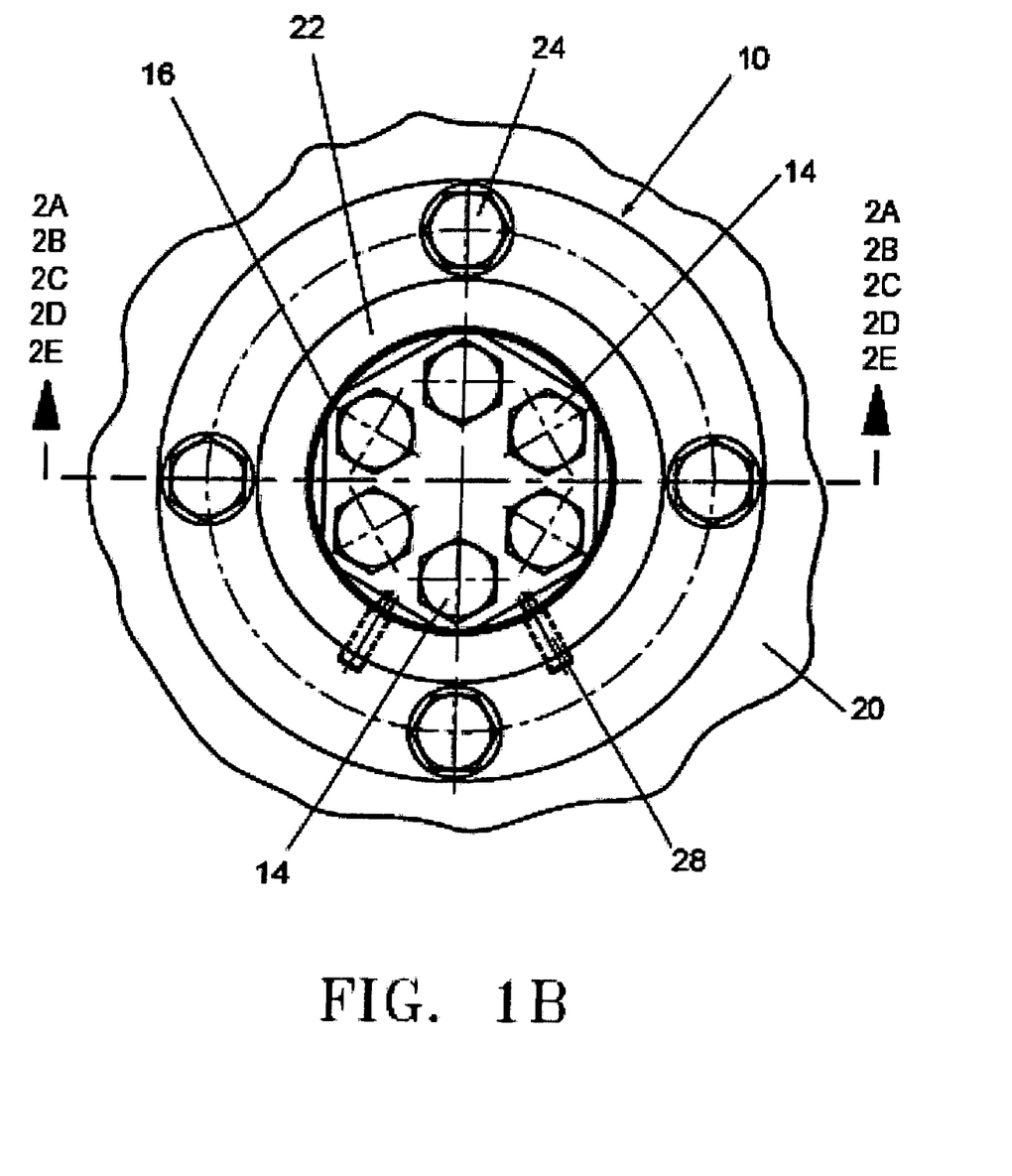
FIG. 1B depicts a plan view of the multi-position stop mechanism of the present invention.

FIG. 1B depicts a plan view of a multi-position stop mechanism 10 in accordance with one embodiment of the present invention. As shown in this figure the multi-position stop mechanism 10 is mounted to a mounting plate 20 by way of mounting hardware 24 that secures outer housing 22, to the mounting plate 20. The mounting plate 20 secures the multi-position stop mechanism 10 to either a stationary or movable part, as discussed above. The mechanism 10 includes a mounting shaft 16 that rotates relative to outer housing 22. The mounting shaft 16 includes adjustable stops 14 that are preferably adjusted to different heights and which can be rotated along with the shaft 16 to put the stops 14 in different stop positions. The details of how the mounting shaft 16 is rotated to place the adjustable stops 14 in different stop positions will be further discussed with respect to FIGS. 2A–2E below.

As shown in FIG. 11B by way of illustration, the multi-position stop mechanism 10 shown in FIG. 1B includes six adjustable stops 14 allowing, in this example, six positions to be realized. The number of stop positions in the present invention is not limited to six, but could be any number of positions, dependent upon functional requirements of the system hardware. The adjustable stops 14 are shown in FIG. 1B by way of illustration as located on a circular pattern. However, the placement of the adjustable stops is not restricted to placements on circular patterns, but can be located in any pattern desired. Further, the position of each stop is determined by functional requirements of the system hardware, e.g. functional requirements of the semiconductor processing equipment.

Figure 2A:
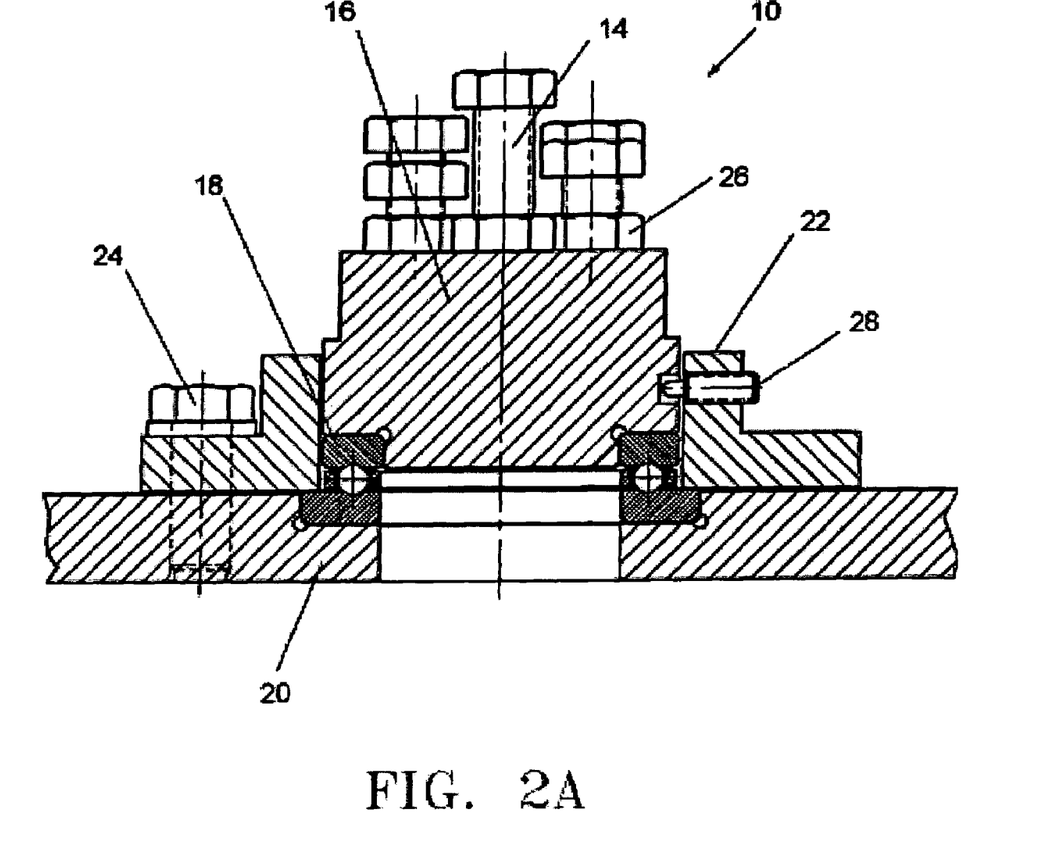
FIG. 2A depicts a cross sectional view of one embodiment of the multi-position stop mechanism of the present invention using a single direction thrust bearing.

FIG. 2A depicts a cross sectional view of one embodiment of the multi-position stop mechanism of the present invention using a single direction thrust bearing 18. The thrust bearing 18 in one example of the present invention is clamped to a mounting plate 20 using for example a constraining outer housing 22, using for example the mounting hardware 24 as shown. The mounting plate 20 can be a part of the system hardware itself (e.g., a part on a chuck of the semiconductor processing system) or can be an adapter that mounts to system hardware. The stop mounting shaft 16, as shown by way of illustration in FIG. 2A, mates to the thrust bearing 18 and provides for example threaded holes (not shown) in the body of the stop mounting shaft 16 to mount the adjustable stops 14, which are illustrated here as standard hex-bolts. A hex nut 26 is included to lock the adjustable stop 14 when adjusted to a desired position. Each adjustable stop is by this method affixed to a position. The adjustable stops can include screws or pins which in one embodiment can be vented to be more compatible with a vacuum environment frequently employed in semiconductor processing.

Accordingly, the stop mounting shaft 16, by rotation for example, can facilitate different stop heights on the device. As the stop mounting shaft 16 is rotated, e.g. by manual rotation, to access each different stop height position, a spring plunger 28 can act as a detent to hold the stop mounting shaft 16 in position. The spring force on the detent can be overcome, to rotate the stop mounting shaft 16 to alternate stop positions.

Figure 4:
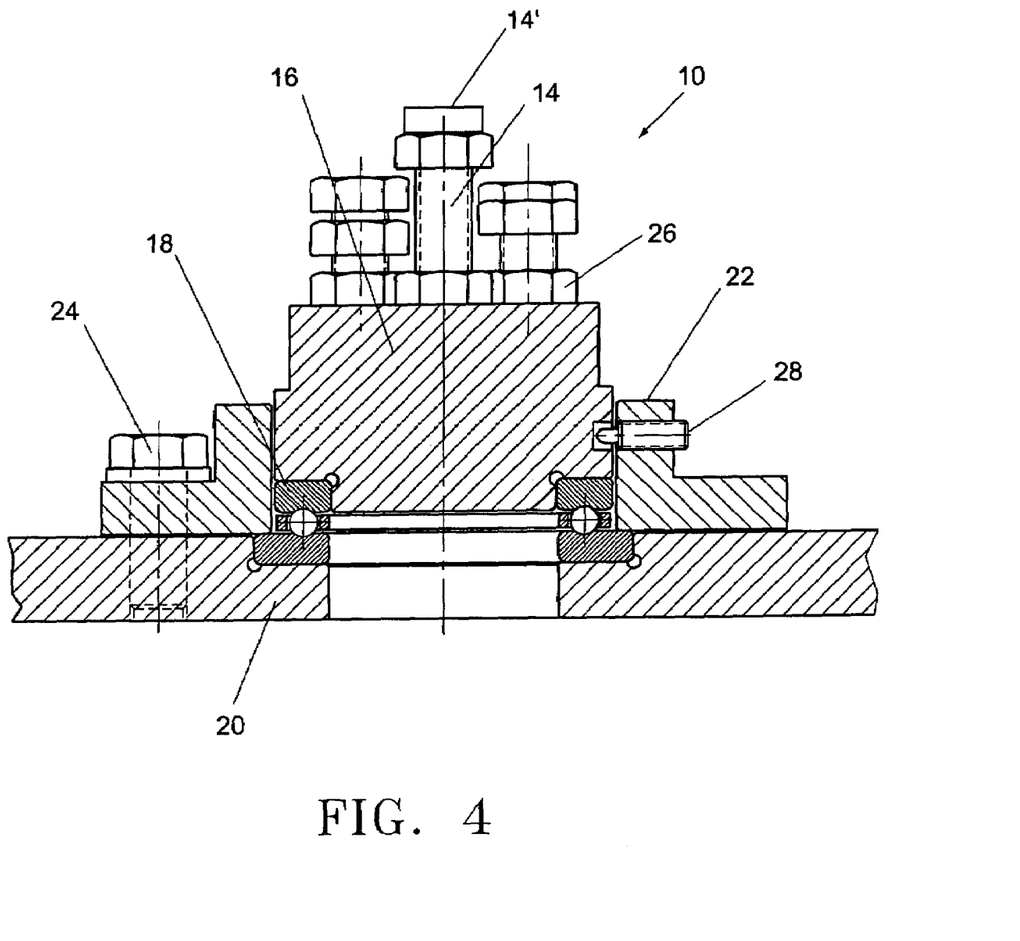
FIG. 4 is a schematic depicting a cross sectional view of one embodiment of the multi-position stop mechanism of the present invention using a single direction thrust bearing and a screw stop including an elastomer thereon.

Once located in a desired position, as one of the adjustable stops 14 contacts its mating surface, the load of the collision is transmitted through the entire assembly to the mounting plate. One of the adjustable stops 14 may have an elastomer affixed to a top head portion (i.e., to an end portion). When the adjustable stop 14 is configured in this manner, the adjustable stop 14 becomes a soft stop. A stop without an elastomer is thus defined herein to be a hard stop. Use of a soft stop can prevent or reduce wear or damage to contact surfaces that may be caused by the collision force. Any number of the adjustable stops 14 can include an elastomer, thus providing a plurality of both soft and hard stops on the stop mounting shaft 16. For example, FIG. 4 illustrates an embodiment of the present invention including a screw stop with an elastomer 15 affixed thereon to form a soft stop. Further, any number of multi-position stop mechanisms of the present invention can be utilized between any two moving members.

Thus, the present invention provides a relatively small and simple multi-position stop mechanism, especially where four or fewer stops are used. This allows the present invention to utilize multiple stops for some associated movement, and provides the ability to retrofit the present invention to existing plasma processing systems or other mechanisms. In addition, the present invention can be used individually, in pairs or in multiples, dependent on the application. Moreover, the present invention can be configured with indexing stops to hold a semiconductor wafer in a particular configuration providing the ability to easily, precisely and repeatable locate stops with respect to other system hardware. Still further, the multi-position stop mechanism of the present invention provides the ability to adjust the present invention manually or through an auxiliary drive mechanism.

Still further the multi-position stop mechanism of the present invention can be used with any type of drive mechanism but is particularly useful with a pneumatic drive system driving a chuck assembly associated with a plasma processing system. The multi-position stop mechanism of the present invention can provide multiple stop positions, providing single or dual stop positions in a variety of locations in a plasma process tool or in any other system employing moving mechanisms which require position indexing. For example, to implement the positioning device (i.e., the multi-position stop mechanism) of the present invention, mating features can be provided on individual parts opposite to where the multi-position stop mechanism is attached (e.g. mating features would be provided opposite part 125 and on part 126 in FIG. 3) to allow a particular multi-position stop position to be realized.

Figure 2B:
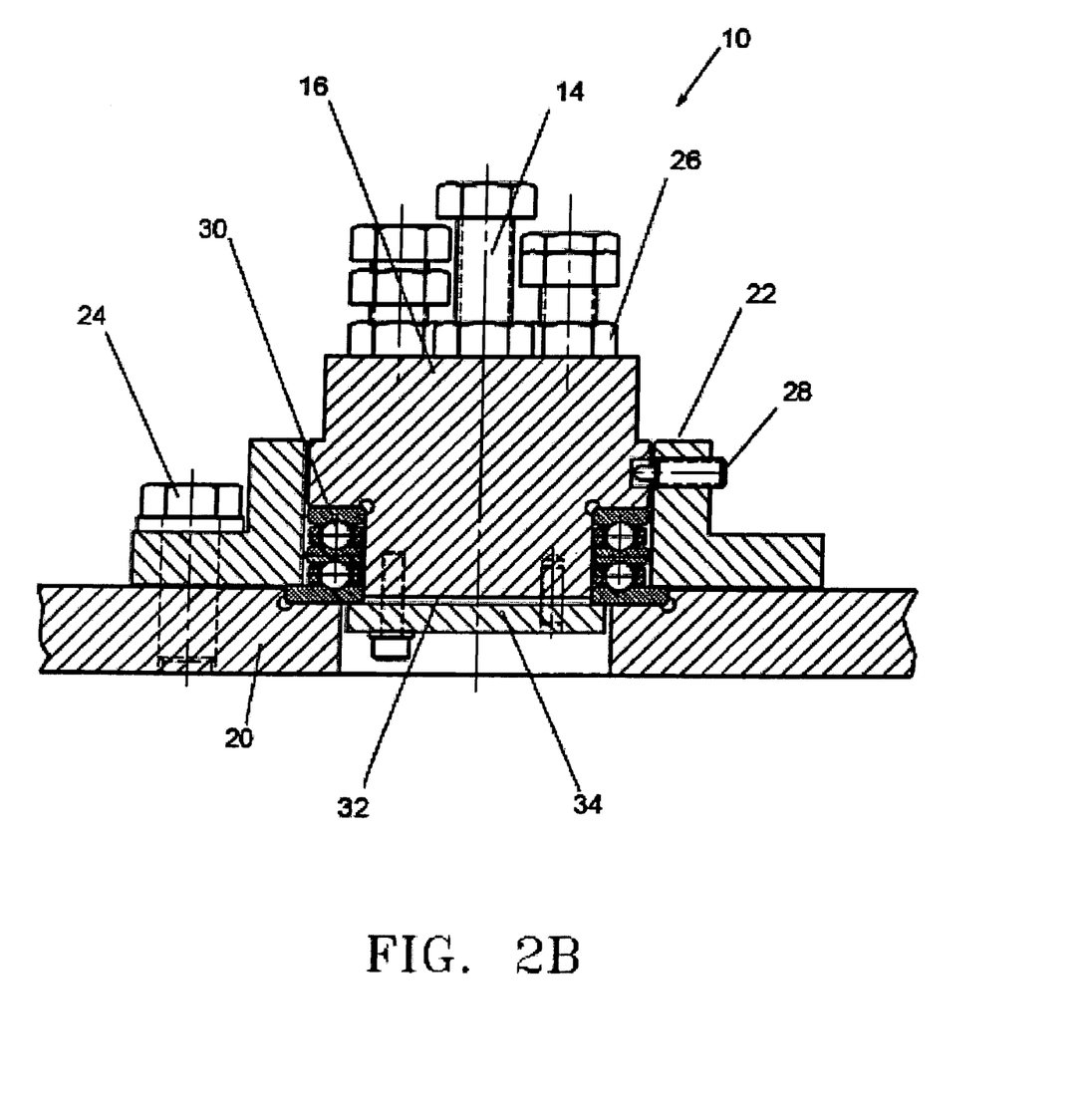
FIG. 2B depicts a cross sectional view of another embodiment of the multi-position stop mechanism of the present invention using a double direction thrust bearing.

FIG. 2B depicts a cross sectional view of another embodiment of the multi-position stop mechanism of the present invention using a double direction thrust bearing 30. The double transit bearings like the single thrust bearing disclosed above rotatably supports the stop mounting shaft 16 in the outer housing 22. The double direction thrust bearing 30 allows mounting of the device in any direction, with respect to gravity. A bearing retainer plate 34 provided with shims 32 supports the double direction thrust bearing 30 to the stop mounting shaft 16.

Figure 2C:
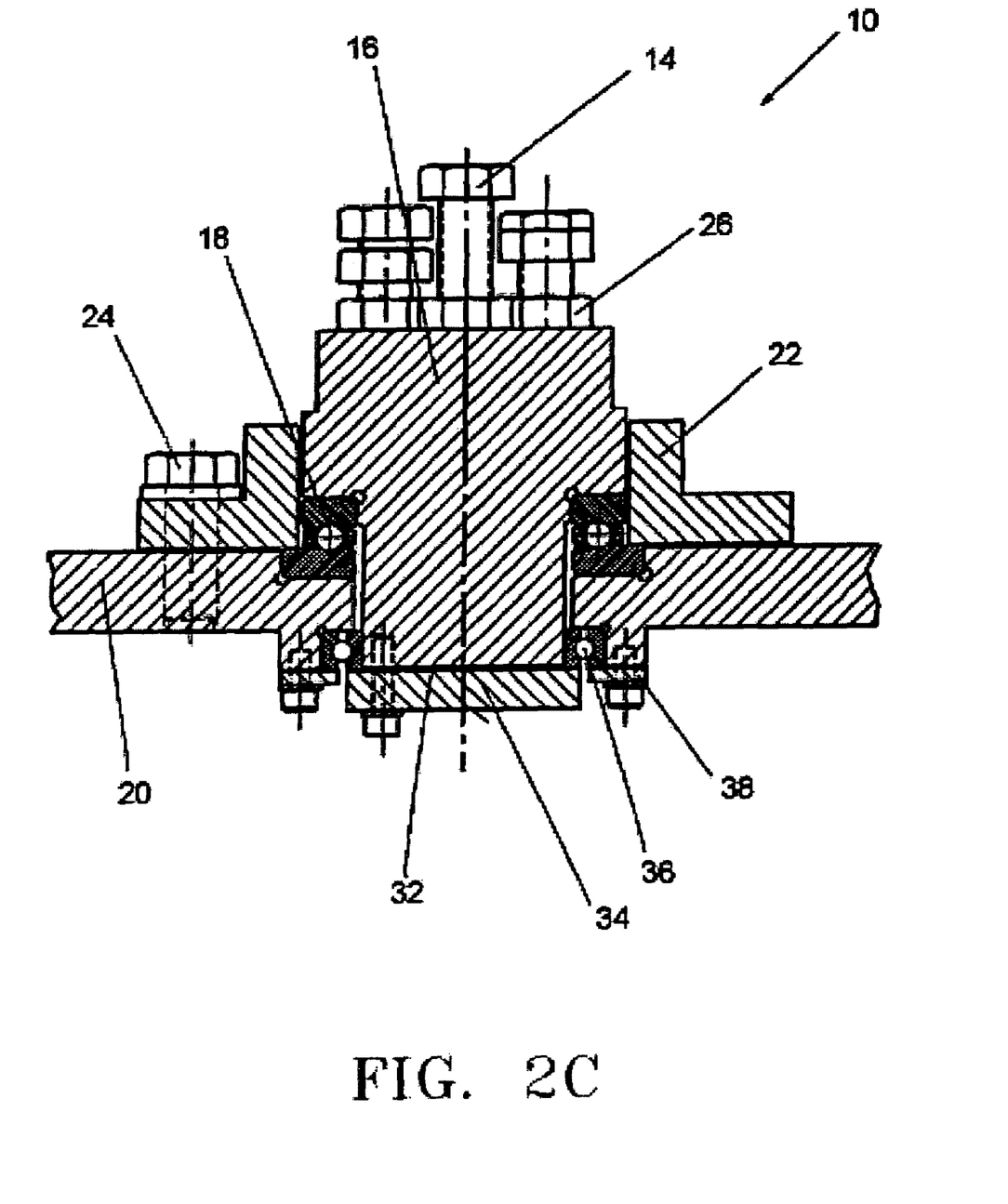
FIG. 2C depicts a cross sectional view of another embodiment of the multi-position stop mechanism of the present invention using a single acting thrust bearing and an associated preload bearing.

FIG. 2C depicts a cross sectional view of another embodiment of the multi-position stop mechanism of the present invention using a single acting thrust bearing 18 and an associated preload bearing 36. These two bearings 18 and 36 represent a configuration that performs a similar function as the double direction thrust bearing 30 described in FIG. 2B. A bearing retainer plate 34 provided with shims 32 supports the preload bearing 36 in the stop mounting shaft 16.

Figure 2D:
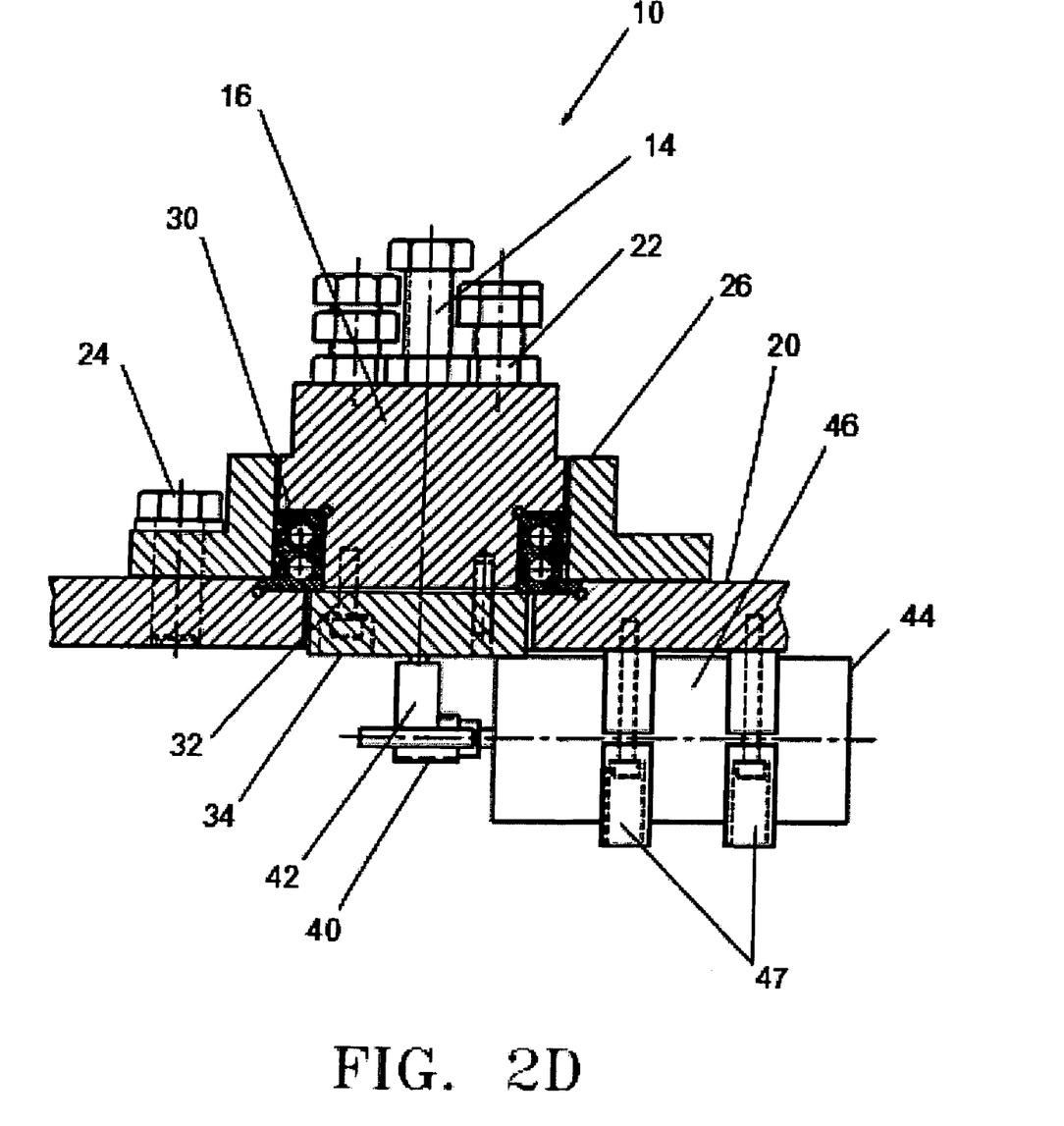
FIG. 2D depicts a cross sectional view of another embodiment of the multi-position stop mechanism of the present invention including a drive motor and associated worm gear to rotate a shaft of the multi-position stop mechanism.

FIG. 2D depicts a cross sectional view of another embodiment the multi-position stop mechanism of the present invention including a drive motor 46 and associated worm gear 42 to rotate the stop mounting shaft 16. In this embodiment, the stop selected is not manually selected. Rather, in this embodiment, stop mounting shaft 16 is rotaed by the drive motor 46 (with mounting brackets 47 to couple drive motor 46 to mounting plate 20) and the associated worm 40 and worm gear 42. A device motor/tachometer/encoder 44 is utilized in a preferred embodiment to track which of the stops 14 are engaged in the stop mounting shaft 16.

Figure 2E:
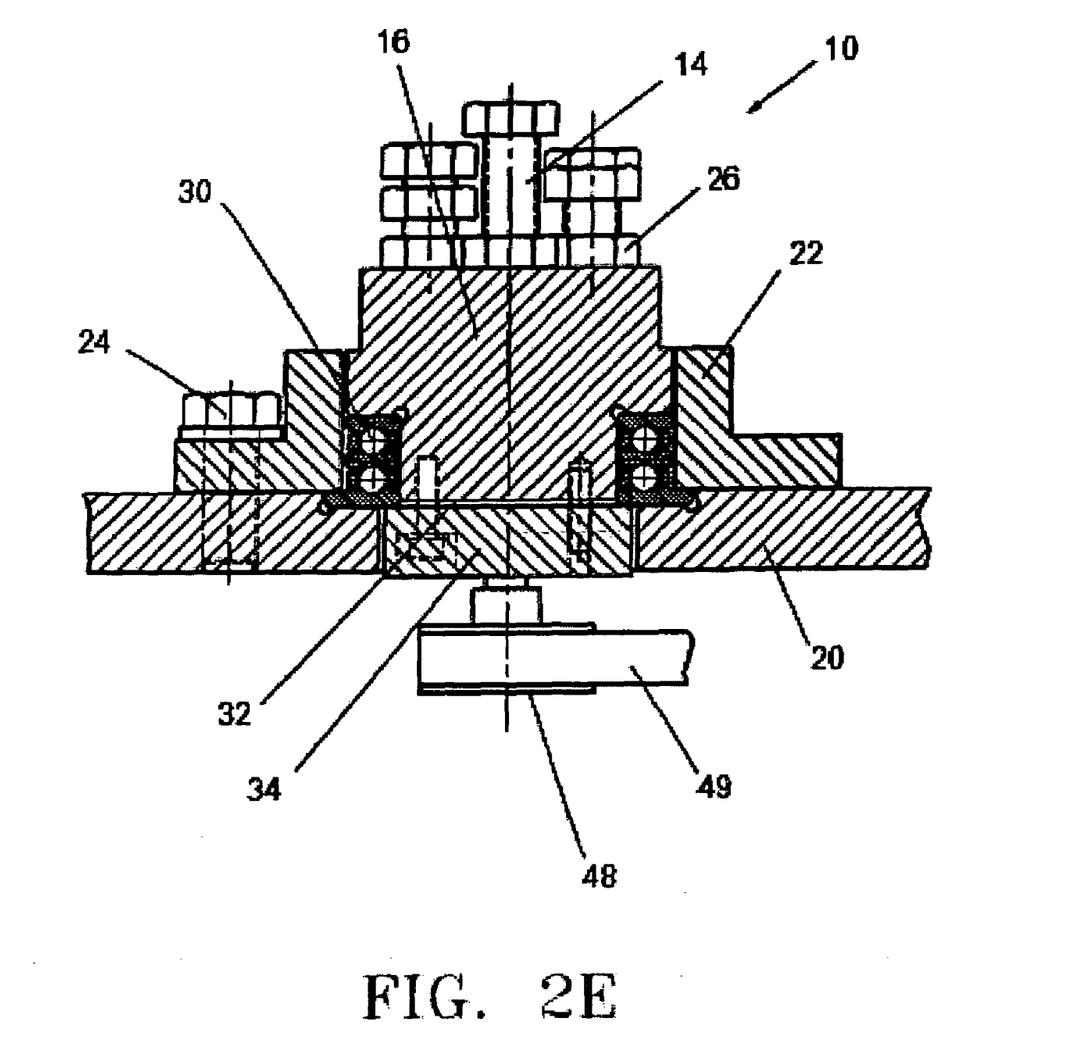
FIG. 2E depicts a cross sectional view of another embodiment of the multi-position stop mechanism of the present invention using a drive motor, drive pulley or gears, and an associated drive belt or chain to rotate a shaft of the multi-position stop mechanism.

FIG. 2E depicts a cross sectional view of another embodiment of the multi-position stop mechanism of the present invention using a drive motor, (not shown here) drive pulley or gears 48 and an associated drive belt 49, or chain to rotate the stop mounting shaft 16. This embodiment can utilize several multi-position stop mechanisms which all are rotated simultaneously using a drive motor, drive pulley or gears, and an associated drive belt or chain.

Figure 2F:
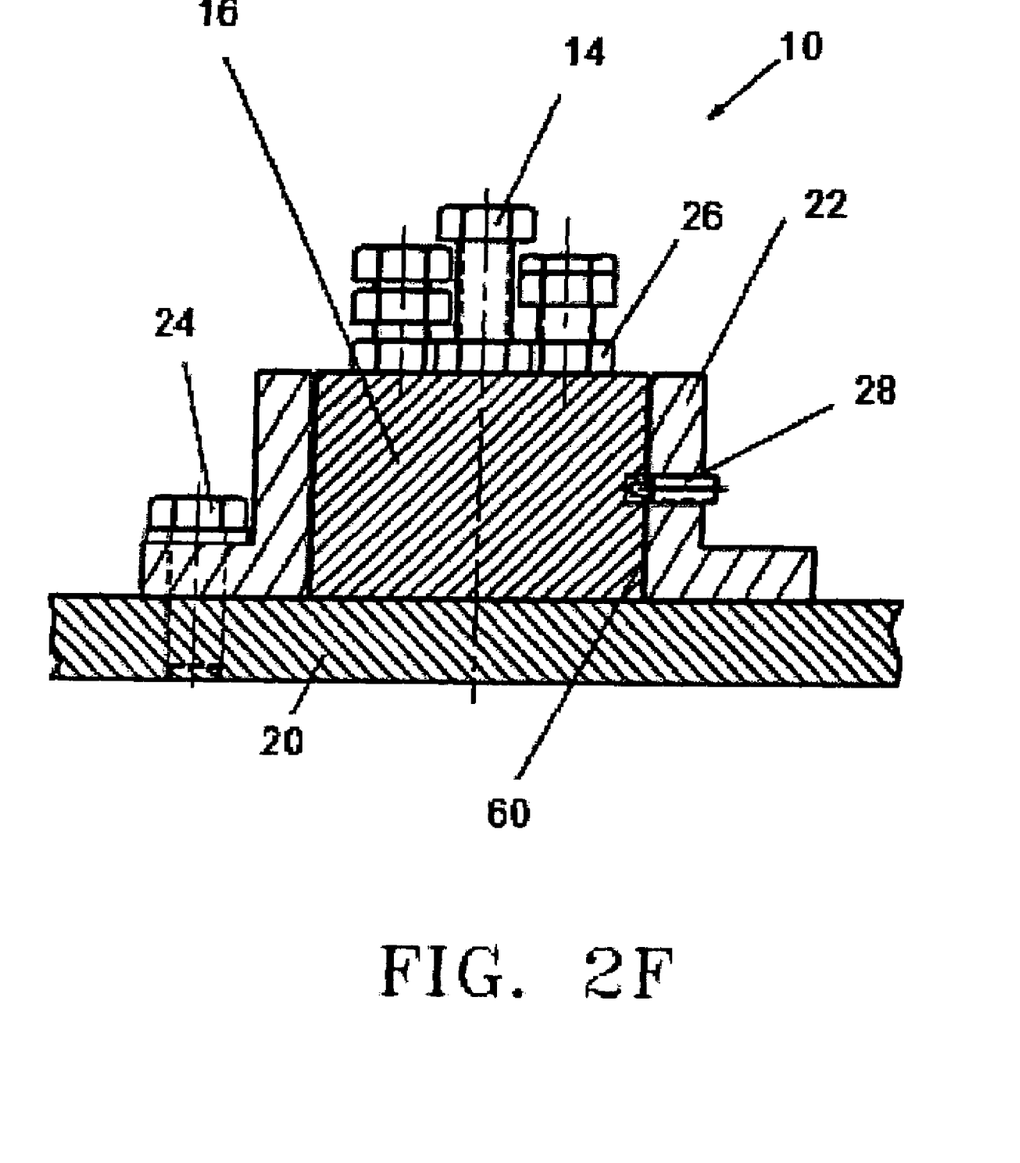
FIG. 2F depicts a cross sectional view of another embodiment of the multi-position stop mechanism of the present invention using a bushing type interface between moving parts of the multi-position stop mechanism.

FIG. 2F depicts a cross sectional view of another embodiment of the multi-position stop mechanism of the present invention using a bushing type interface 60 between moving parts, such as for example between the stop mounting shaft 16 and the outer housing. Bushing features are formed by the cylindrical mating features of outer housing 22 and the stop mounting shaft 16. Detent mechanisms, such as for example the spring plunger 28, can be utilized for stopping rotation of the stop mounting shaft 16 at a desired angular position. Rotation and selection of the position can be made manually or automatically.

Figure 2G:
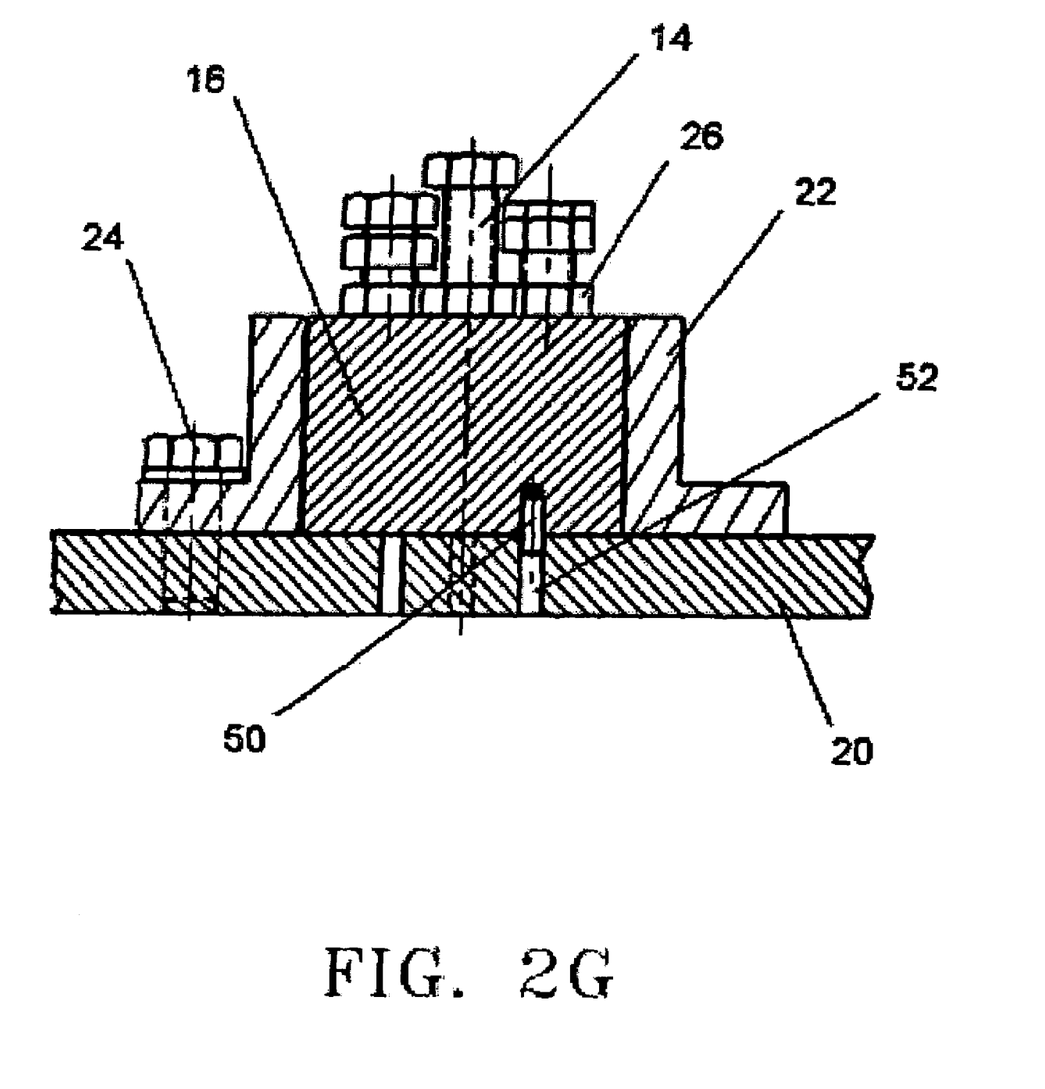
FIG. 2G is a schematic depicting a cross sectional view of another embodiment of the multi-position stop mechanism of the present invention using a stop position pin engaging a stop position hole on a shaft of the multi-position stop mechanism.

FIG. 2G depicts a cross sectional view of another embodiment of the multi-position stop mechanism of the present invention using a stop position pin 50 engaging a stop position hole 52 on the base of the stop mounting shaft 16. In this case, the stop position is selected and secured with the stop position pin 50 engaging a stop position hole 52 as the stop mounting shaft is rotated to the desired stop position. Rotation and selection of the position can be made manually or automatically.

Numerous modifications and variations of the present invention are possible in light of the above teachings. It is therefore to be understood that within the scope of the appended claims, the invention may be practiced otherwise than as specifically described herein.

The invention claimed is:

1. A multi-stop mechanism for providing multiple stop positions between first and second objects that are movable into and out of stop contact with one another, comprising:
    a housing securing the multi stop mechanism to one of said first object and said second object;
    a rotatable shaft rotatably mounted to said housing for rotation about an axis offset from a center of said one of said first object and said second object; and
    a plurality of stops located on the rotatable shaft such that the stops may be rotated to different positions relative to said housing when said shaft is rotated within said housing,
    wherein said rotatable shaft positions one of said stops to a position where the stop contacts the other of said first and second object that the multi-stop mechanism is not attached to when the first and second objects are moved into stop contact with one another.

2. The multi-stop mechanism of claim 1, wherein at least one of said first object and said second object comprises a translatable plate.

3. The multi-stop mechanism of claim 1, wherein at least one of said stops comprises an adjustable stop configured to have an adjustable height relative to said housing.

4. The multi-stop mechanism of claim 3, wherein said adjustable stop comprises a screw.

5. The multi-stop mechanism of claim 1, wherein at least one of said stops comprises an elastomer affixed to an end of the stop.

6. The multi-stop mechanism of claim 1, further comprising:
a bearing mounted to said rotatable shaft and configured to facilitate rotation of the shaft relative to the housing.

7. The multi-stop mechanism of claim 6, wherein said bearing comprises a single direction thrust bearing.

8. The multi-stop mechanism of claim 6, wherein said bearing comprises a double direction thrust bearing.

9. The multi-stop mechanism of claim 6, wherein said bearing comprises a single acting thrust bearing and an associated preload bearing.

10. The multi-stop mechanism of claim 1, further comprising:
a bushing interface between the rotatable shaft and the housing.

11. The multi-stop mechanism of claim 1, further comprising:
a drive motor; and
a drive mechanism configured to rotate the rotatable shaft.

12. The multi-stop mechanism of claim 11, wherein said drive mechanism comprises at least one of a pulley and a gear.

13. The multi-stop mechanism of claim 11, wherein said drive mechanism comprises at least one of a belt and a chain.

14. The multi-stop mechanism of claim 1, further comprising:
an angular position location mechanism configured to locate an angular position of said rotatable shaft.

15. The multi-stop mechanism of claim 14, wherein said angular position location mechanism comprises:
a detent on a periphery of said rotatable shaft; and
a pin mounted on the housing and configured to engage the detent.

16. The multi-stop mechanism of claim 14, wherein said angular position location mechanism comprises:
a mounting plate attaching to said at least one of said first object and said second object that secures the rotatable shaft;
a stop position hole in a base of said rotatable shaft; and
a pin through at least one of the mounting plate and said at least one of said first object and said second object that secures the rotatable shaft, said pin engaging the stop position hole.

17. The multi-stop mechanism of claim 14, wherein said angular position location mechanism comprises:
a drive motor configured to rotate the rotatable shaft; and
an encoder configured to determine an angular position of the rotatable shaft.

18. A multi-stop mechanism for providing multiple stop positions between first and second objects that are movable into and out of stop contact with one another, comprising:
a housing securing the multi stop mechanism to one of said first object and said second object;
a rotatable shaft rotatably mounted to said housing for rotation about an axis offset from a center of said one of said first object and said second object;
a plurality of stops located on the rotatable shaft such that the stops may be rotated to different positions relative to said housing when said shaft is rotated within said housing; and
means for positioning one of said plurality of stops to a position where the stop contacts the other of said first and second object that the multi-stop mechanism is not attached to when the first and second objects are moved into stop contact with one another.

19. The multi-stop mechanism of claim 18, wherein at least one of said first object and said second object comprises a translatable plate.

20. The multi-stop mechanism of claim 18, wherein at least one of said stops comprises means for adjusting a height of said at least one of said stops relative to said housing.

21. The multi-stop mechanism of claim 19, wherein said means for adjusting comprises a screw.

22. The multi-stop mechanism of claim 18, wherein at least one of said stops comprises an elastomer affixed to an end of the stop.

23. The multi-stop mechanism of claim 18, further comprising:
a bearing mounted to said rotatable shaft and configured to facilitate rotation of the shaft relative to the housing.

24. The multi-stop mechanism of claim 23, wherein said bearing comprises a single direction thrust bearing.

25. The multi-stop mechanism of claim 23, wherein said bearing comprises a double direction thrust bearing.

26. The multi-stop mechanism of claim 23, wherein said bearing comprises a single acting thrust bearing and an associated preload bearing.

27. The multi-stop mechanism of claim 18, further comprising:
a bushing interface between the rotatable shaft and the housing.

28. The multi-stop mechanism of claim 18, wherein said means for positioning comprises: means for rotating the rotatable shaft.

29. The multi-stop mechanism of claim 18, wherein said means for positioning comprises: means for locating an angular position of said rotatable shaft.

30. The multi-stop mechanism of claim 29, wherein said means for locating an angular position comprises: means for determining an angular position of the rotatable shaft.

* * * * *